United States Patent [19]

Kawai et al.

[11] Patent Number: 5,214,025
[45] Date of Patent: May 25, 1993

[54] METHOD OF MANUFACTURING OXIDE HIGH-TEMPERATURE SUPERCONDUCTOR THIN FILM BY MEANS OF MOLECULAR-BEAM EPITAXY

[75] Inventors: Maki Kawai; Shunji Watanabe, both of Tokyo, Japan

[73] Assignee: President of Tokyo Institute of Technology, Tokyo, Japan

[21] Appl. No.: 844,876

[22] Filed: Mar. 3, 1992

Related U.S. Application Data

[63] Continuation of Ser. No. 677,446, Mar. 29, 1991, abandoned.

[30] Foreign Application Priority Data

Apr. 13, 1990 [JP] Japan ................................ 2-98484

[51] Int. Cl.$^5$ .................................................. B05D 5/12
[52] U.S. Cl. ...................................... 505/1; 505/730; 505/742; 505/736; 427/62; 427/126.3; 427/404; 427/405
[58] Field of Search ............... 505/1, 730, 736, 742; 427/62, 63, 126.3, 405, 404

[56] References Cited

U.S. PATENT DOCUMENTS 4,771,015 9/1988 Kanai et al. ......................... 437/109

FOREIGN PATENT DOCUMENTS 1-252504 10/1989 Japan .

OTHER PUBLICATIONS

Tsaur et al., "Preparation of superconducting YBa$_2$Cu$_3$O$_x$ thin films by oxygen annealing of multilayer metal films", *Appl. Phys. Lett.* 54(11) Sep. 1987 pp. 858–860.

Kuroda et al, "Preparation of new high-T$_c$ superconducting Oxide Bi-Sr-Ca-Cu-O thin film by electron beam deposition technique" *Jpn. J. Appl. Phys.* 27(4) Apr. 1988 L625–L627.

Nonaka et al, "Preparation of NdBa$_2$Cu$_3$O$_{7-\delta}$ films in ultrahigh vacuum with a NO$_2$ supersonic molecular beam", *Appl. Phys. Lett.* 57(26) Dec. 1990 pp. 2850–2852.

Schuhl et al, "Atomic layer by atomic layer growth of DyBaCuO superconducting thin films by molecular beam epitaxy", *Appl. Phys. Lett.* 57(8) Aug. 1990 pp. 819–821.

Ohkubo, "Three phases in BiSrCaCuO thin films synthesized by the Multilayer deposition method", *Jpn. J. Appl. Phys.* 27(7) Jul. 1988 L1271–L1274.

Nakayama et al, "In Situ growth of Bi-Sr-Ca-Cu-O thin films by molecular beam epitaxy technique with pure ozone", *Jpn. J. Appl. Phys.* 28(7) Jul. 1989 L1217–L1219.

*Japanese Journal of Applied Physics*, vol. 29, No. 7, Jul. 1990, pp. L1111–L1113, S. Watanabe, et al., "Molecular Beam Epitaxy Study of Bi$_2$Sr$_2$CuO$_x$ Using NO$_2$ as an Oxidizing Agent".

*J. Vac. Sci. Technol.*, A 8, (6), Nov./Dec. 1990, pp. 4104–4105, M. Kawai, et al., "Ultrathin Film of Bi$_2$Sr$_2$CuO$_x$ Formed by Molecular Beam Epitaxy Using NO$_2$".

Patent Abstracts of Japan, vol. 13, No. 254 (E-772)(3602), Jun. 13, 1989; & JP-A-151682 (Sumito Electric) Feb. 27, 1989.

*Primary Examiner*—Michael Lusigan
*Assistant Examiner*—Roy V. King
*Attorney, Agent, or Firm*—Oblon, Spivak, McClelland, Maier & Neustadt

[57] ABSTRACT

Monatomic layers each formed of a single metal are sequentially formed on a substrate using a molecular-beam epitaxy to form a multilayered metal film consisting of a plurality of types of metals, and sequentially with formation the monatomic layers, nitrogen dioxide gas as an oxidizer is supplied to oxidize the multilayered metal film. The same operation is repeatedly performed a predetermined number of times to form an oxide high-temperature superconductor thin film having a predetermined thickness.

2 Claims, 6 Drawing Sheets

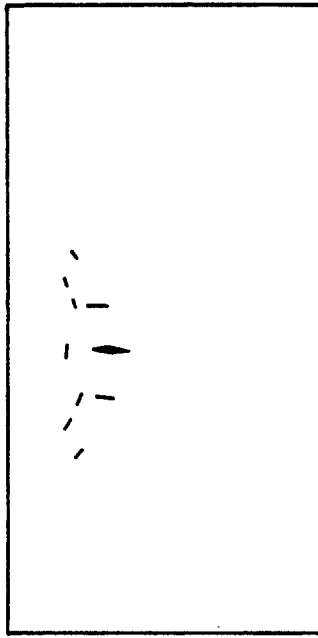
FIG. 4A SrTiO₃(100) SURFACE (BEFORE GROWTH)
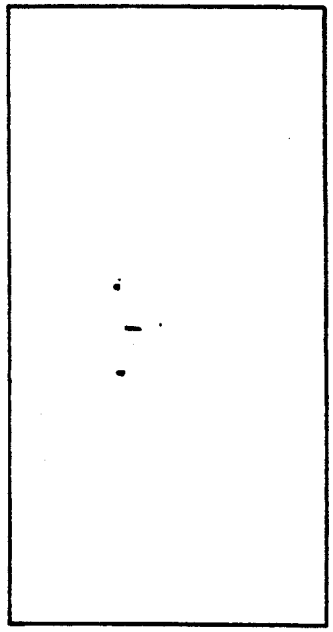
FIG. 4B SURFACE OXIDIZED BY NO₂ (Tsub=350°C, 20min)
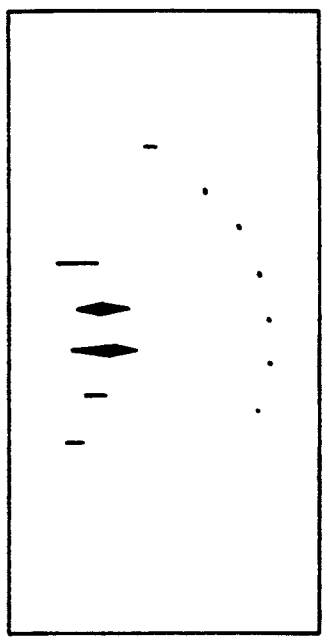
FIG. 4C SURFACE OBTAINED BY DEPOSITING Sr, Cu, AND Bi ON SrTiO₃(100) SURFACE
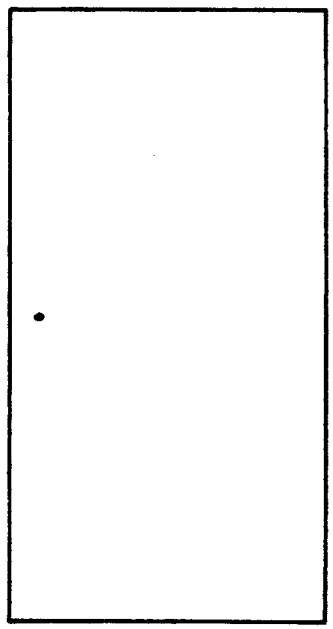
FIG. 4D SURFACE OXIDIZED BY NO₂ (Tsub=350°C, 30min)

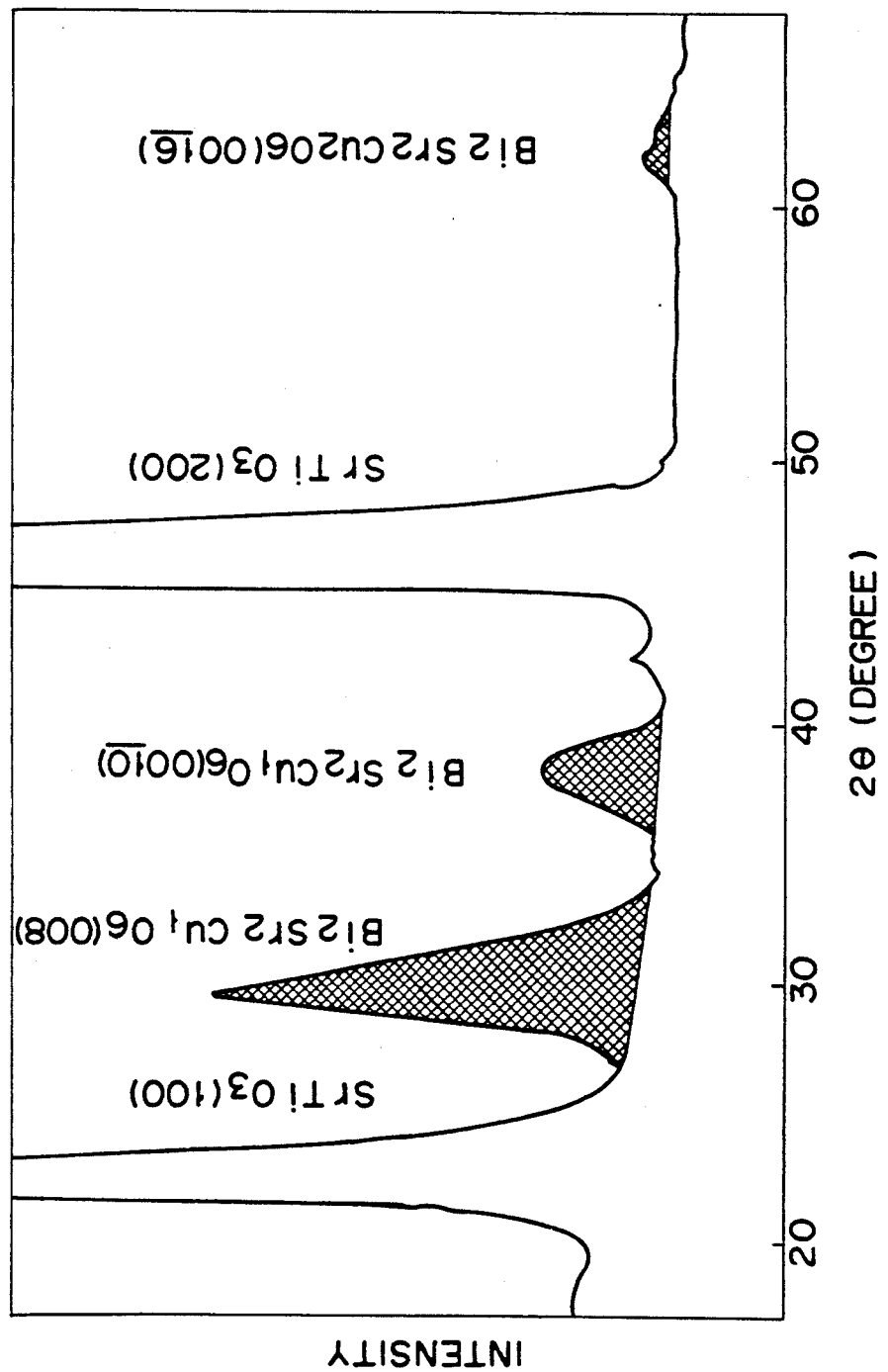

METHOD OF MANUFACTURING OXIDE HIGH-TEMPERATURE SUPERCONDUCTOR THIN FILM BY MEANS OF MOLECULAR-BEAM EPITAXY

This application is a continuation of application Ser. No. 07/677,446, filed on Mar. 29, 1991, now abandoned.

BACKGROUND OF THE INVENTION

1. Field of the Invention

The present invention relates to a method of manufacturing an oxide high-temperature superconductor thin film by means of a molecular-beam epitaxy (to be referred to as an MBE hereinafter).

2. Description of the Related Art

Conventionally, various film formation methods including a magnetron sputtering method, a laser sputtering method, a reactive vapor deposition method, and an MBE method have been attempted in the manufacture of an oxide high-temperature superconductor thin film.

In any of these methods, a structure of an oxide superconductor can be formed by precisely controlling film formation conditions.

In addition, various types of oxidation gases are used to incorporate oxygen into crystals, and it is known that a temperature required for formation of an oxide film changes in accordance with the type of gas used.

For example, in crystallization of a Bi—Sr—Cu—O superconductor, the crystallization conditions are as follows:

Oxidation temperature: 500° C. or more Required vacuum degree corresponding to type of oxidizing agent
oxygen gas ($O_2$) $10^{-2}$ to $10^{-3}$ Torr
ozone ($O_3$) : $10^{-5}$ Torr As described above, even when ozone which is conventionally considered to be most active is used, the crystallization temperature must be 500° C. or more, and generally, 600° C. to 700° C.

In addition, even when a highly active gas such as ozone is used, a required vacuum degree is at most about $10^{-5}$ Torr, i.e., outside a high vacuum range.

However, when an application of an oxide superconductor is taken into consideration, in particular, to form a composite structure with various types of other materials as electronics devices, a temperature of 500° C. is too high and therefore impractical in terms of the heat resistances of the electronics devices.

Furthermore, to obtain a high-quality thin film by the film formation methods as described above, it is desired to execute film formation at a pressure as low as possible, i.e., within a high vacuum range. However, even when ozone having the highest activity is used, a gas pressure upon film formation must be $10^{-4}$ to $10^{-5}$ Torr or more. This pressure value is far from an ideal low pressure value for obtaining a high-quality thin film.

SUMMARY OF THE INVENTION

The present invention has been made in consideration of the above situation and has as its object to provide a method of manufacturing an oxide superconductor thin film by means of an MBE, which can form an oxide superconductor thin film by executing oxidation at an ideal low pressure (within a high vacuum range) and at a low temperature which does not interfere with formation of a composite structure with various types of other materials as electronics devices or the like.

According to the present invention, there is provided a method of manufacturing an oxide superconductor thin film by means of a molecular-beam epitaxy, comprising the steps of sequentially forming monatomic layers each formed of a single metal on a substrate using the molecular-beam epitaxy method to form a multilayered metal film consisting of a plurality of types of metals, sequentially with formation of the monatomic layers, supplying nitrogen dioxide ($NO_2$) gas as an oxidizer to oxidize the multilayered metal film, and repeatedly executing the same operation a predetermined number of times to form an oxide high-temperature superconductor thin film having a predetermined thickness.

According to the above method, after a film constituted by a plurality of layers is formed, the formed film is oxidized at a low temperature in a high vacuum using $NO_2$, and this operation is repeatedly executed a plurality of times to form a thin film having a necessary thickness as a whole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 4A, 4B, 4C and 4D are views showing measurement results obtained by reflection high energy electron diffraction;

FIG. 7 is a graph showing an X-ray diffraction pattern of a formed oxide superconductor thin film.

DETAILED DESCRIPTION OF THE PREFERRED EMBODIMENTS

The present invention will be described in detail below.

According to the present invention, monatomic layers each formed of a single metal are sequentially formed on a substrate using an MBE method to form a multilayered metal film of a plurality of types of metals, and this multilayered metal film is oxidized by supplying nitrogen dioxide gas as an oxidizer. This operation is repeatedly executed a predetermined number of times to form an oxide superconductor thin film having a predetermined thickness.

In this method, in the process of supplying the nitrogen dioxide gas as an oxidizer to oxidize the multilayered metal film, the substrate temperature is preferably held at 300° C. to 380° C.

In addition, in this oxidation process, a vacuum degree is preferably held at about $10^{-7}$ Torr.

According to the present invention, after the multilayered structure constituted by the single-metal films is formed on the substrate, oxidation is performed by nitrogen dioxide. Therefore, since the oxide superconductor thin films can be grown one after another, film formation can be performed at a low temperature in a high vacuum compared to conventional methods. As a result, a high-quality film can be obtained. In addition, since the film formation temperature can be decreased, a composite structure with other electronics devices can be easily formed.

Figure 1:
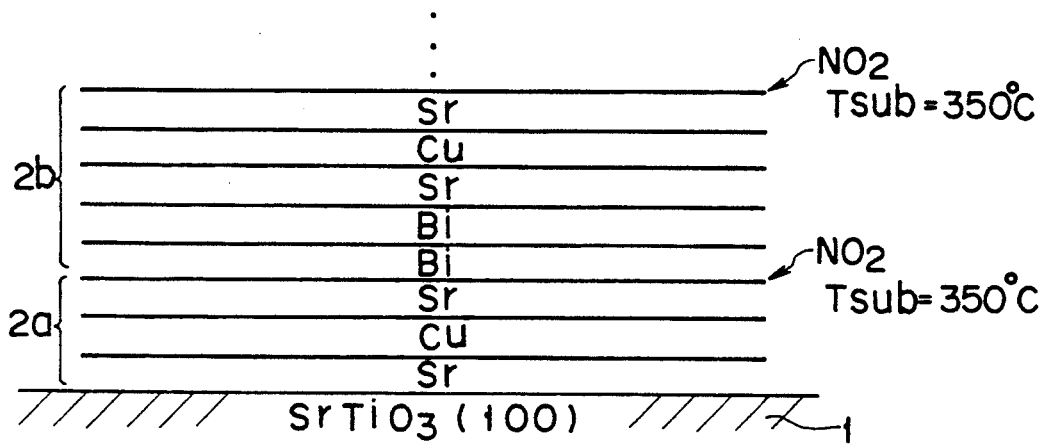
FIG. 1 is a sectional view showing a substrate and a thin film portion for explaining an embodiment of a method according to the present invention.
Figure 2:
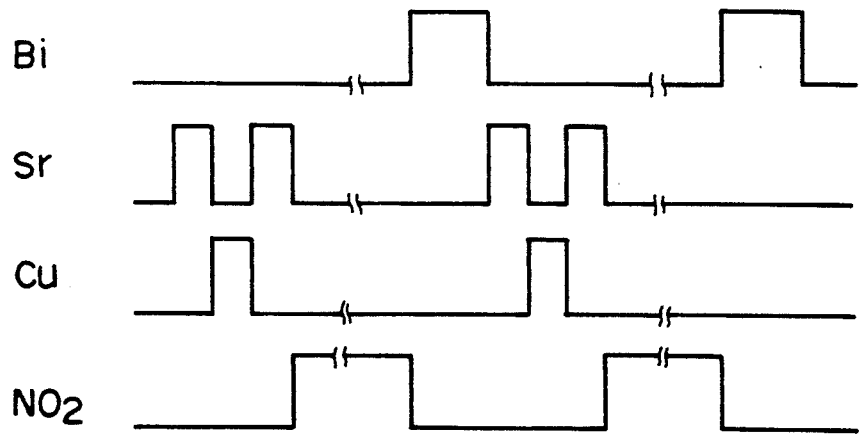
FIG. 2 is a timing chart showing an MBE method.

An embodiment of the method according to the present invention will be described below. FIG. 1 is a sectional view showing a thin film portion including a substrate according to this embodiment, and FIG. 2 is a timing chart of the MBE method.

Figure 3A:
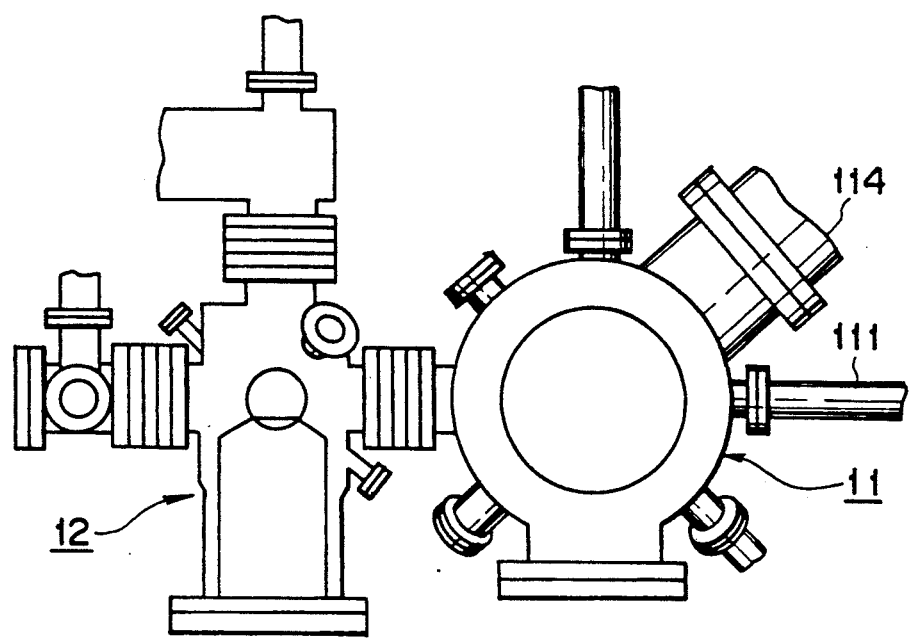
FIG. 3A is a side view showing an atomic layer-controlling oxide thin film formation apparatus.
Figure 3B:
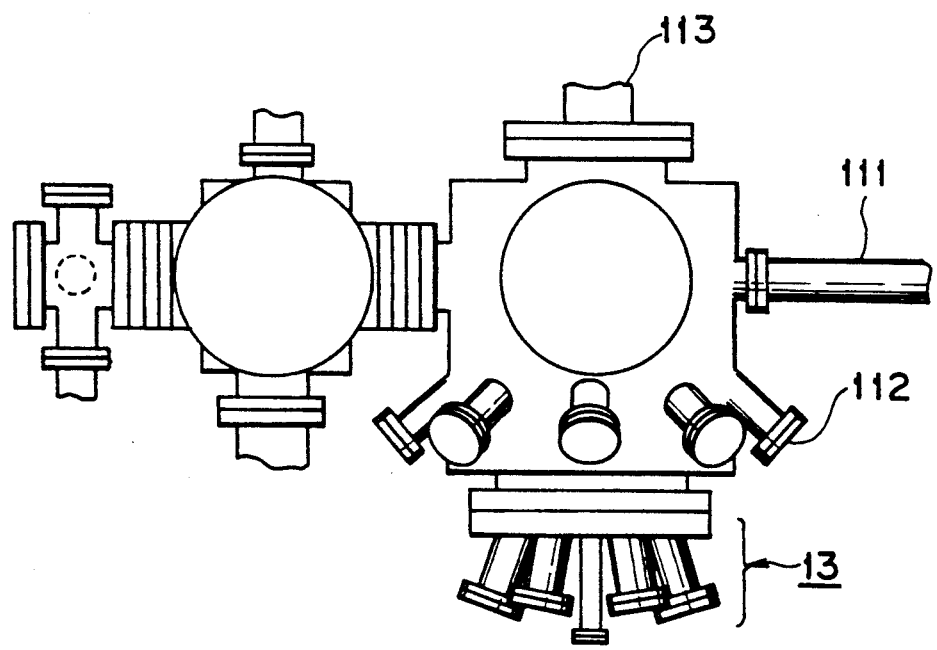
FIG. 3B is a plan view thereof.

In this embodiment, $SrTiO_3$ (100) is used as the material of a substrate 1. The substrate 1 is placed in an atomic layer-controlled oxide thin film formation apparatus (to be referred to as a thin film formation apparatus hereinafter) as shown in FIGS. 3A and 3B, and a reaction chamber is evacuated to be $2 \times 10^{-10}$ Torr.

As a first group of metal monatomic layers 2a, films of Sr, Cu, and Sr are formed on the substrate 1 in the order named from the substrate 1 in a vacuum of $10^{-8}$ Torr at room temperature by the MBE, as shown in FIG. 1.

After the film formation of the first group of metal monatomic layers 2a is completed, $NO_2$ gas is supplied in an atomsphere at $10^{-7}$ Torr and 300° C. to oxidize the layers 2a.

While the oxidation process progresses, a degree of progress of the oxide film formation is measured by reflection high energy electron diffraction.

After the film formation of the first group of metal monatomic layers 2a is completed, $NO_2$ gas is supplied in an atmosphere at $10^{-7}$ Torr and 300° C. to oxidize the layers 2a.

While the oxidation process progresses, a degree of progress of the oxide film formation is measured by reflection high energy electron diffraction. Although both streaks and spots are found during progress of the $NO_2$ oxidation, only the streaks remain after further continuation of the oxidation to indicate that the oxidation and the crystallization are completed.

After the oxidation of the first group of metal monatomic layers 2a is completed, a second group of metal monatomic layers 2b constituted by Bi, Bi, Sr, Cu, and Sr films are formed following the same procedures as for the first layers 2a. The second metal monatomic layers 2b are oxidized and the end of oxidation is checked following the same procedures as for the first group of metal monatomic layers 2a.

In this manner, the operation is repeatedly performed until a thin film having a necessary thickness is formed.

A thin film formation apparatus as an apparatus for performing the above film formation is shown in FIGS. 3A and 3B, in which FIG. 3A is a side view of the apparatus and FIG. 3B is a plan view thereof. This apparatus comprises as its main parts a reflection high energy electron diffraction device 11, an electron spectroscopy device 12, and a multielement vapor deposition device 13.

Of these devices, the reflection high energy electron diffraction device 11 includes a sample conveyor mechanism 111, a gas supply mechanism 112, a manipulator 113, and an exhaust system 114.

FIGS. 4A to 4D show the measurement results of the progress degree of the oxide film formation obtained by the reflection high energy electron diffraction device described above. FIG. 4A shows a state of the surface of the substrate 1 obtained before the metal monatomic layers are formed; FIG. 4B, a state obtained after the $NO_2$ oxidation is performed (at a temperature of 350° C. and a pressure of $2 \times 10^{-7}$ Torr for 20 minutes), in which streaks and spots are found; FIG. 4C, a state obtained when the Sr, Cu, and Bi films are formed on the substrate 1; and FIG. 4D, a state obtained after the $NO_2$ oxidation is further executed (at a temperature of 350° C. and a pressure of $2 \times 10^{31\ 7}$ Torr for 30 minutes), in which only the streaks remain.

Figure 5:
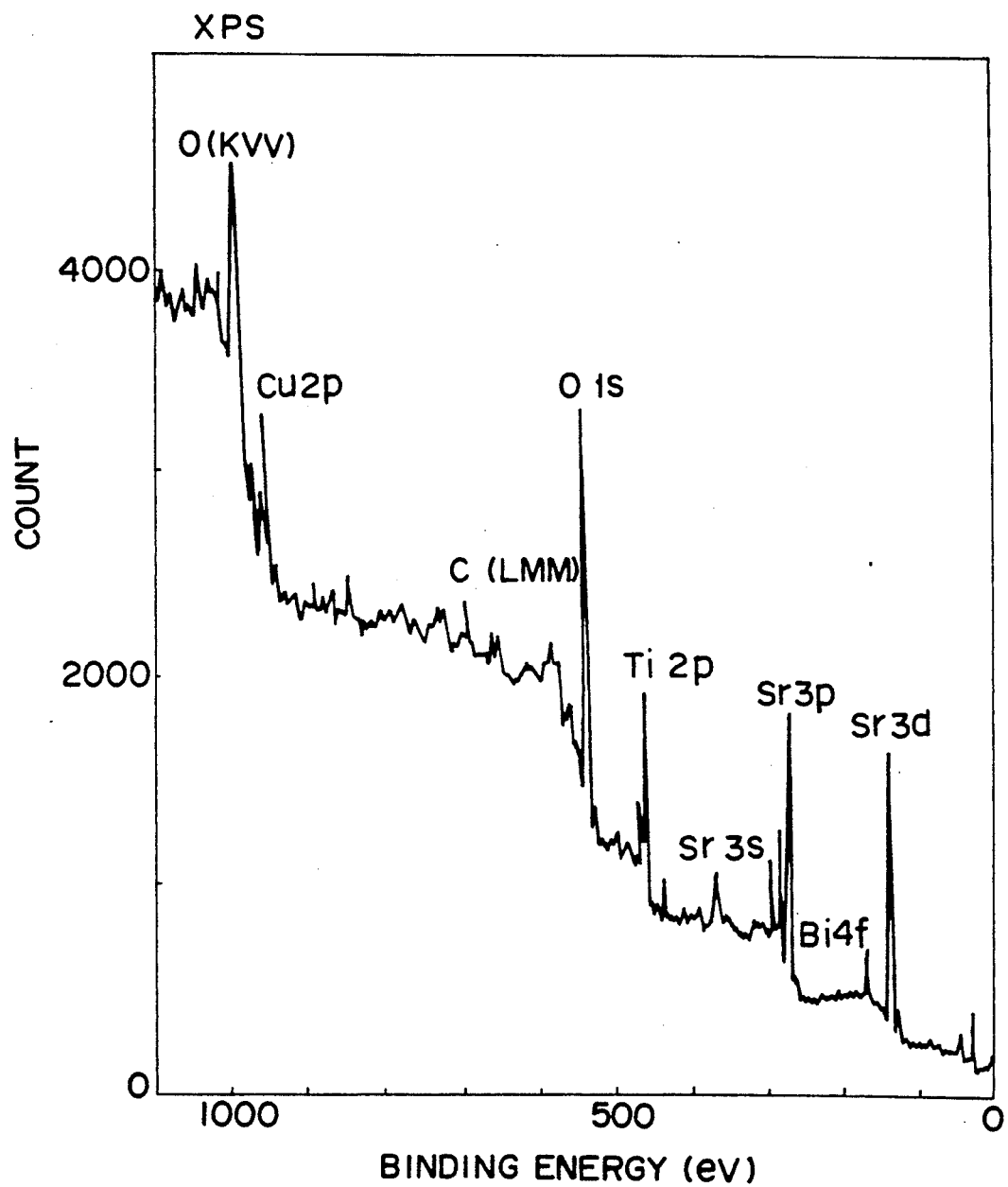
FIGS. 5 and 6 are graphs showing measurement results obtained by X-ray photoelectron spectroscopy.
Figure 6:
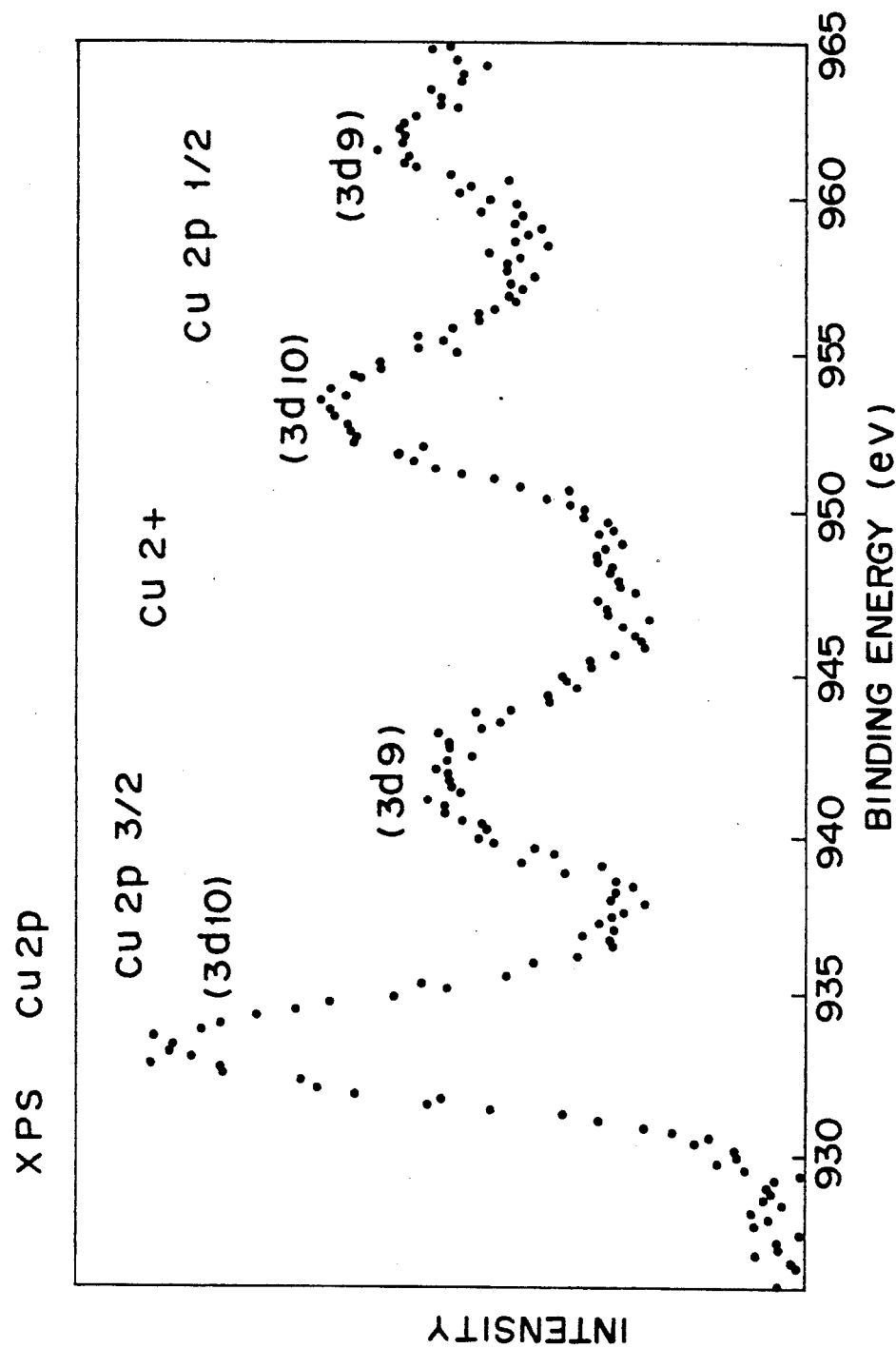

FIG. 5 shows measurement results obtained by the X-ray photoelectron spectroscopy (XPS), which indicates that necessary elements are present in the thin film. FIG. 6 shows measurement results similarly obtained by the XPS, which indicates that even copper, which is a most difficult one to be oxidized of these elements, is in a required oxidation state. FIG. 7 shows an X-ray diffraction pattern of the formed film, indicating that the film has a $Bi_2Sr_2Cu_1O_6$ structure.

According to this embodiment, since $Bi_2Sr_2CuO_x$ layers can be grown one after another on the $SrTiO_3$ (100) substrate 1 at 300° C. and $2 \times 10^{-7}$ Torr using $NO_2$, film formation can be performed at a low temperature in a high vacuum compared to conventional methods. As a result, a high-quality film can be obtained. In addition, since the film formation temperature can be decreased, a composite structure with other electronics devices can be easily formed.

Note that although $SrTiO_3$ and $Bi_2Sr_2CuO$ are used as the materials of the substrate and the oxide superconductor, respectively, in the above embodiment, the materials are not limited to these materials.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a bismuth based oxide high-temperature superconductor film by means of a molecular-beam epitaxy, comprising the steps of:

first, sequentially forming monatomic layers, each layer formed of a single metal on a substrate using the molecular-beam epitaxy method to form a multilayered metal film consisting of a plurality of metals for forming said oxide high temperature superconductor film, wherein one of said layers is formed from bismuth atoms;

second, sequentially with formation of the monatomic layers, supplying nitrogen dioxide gas as an oxidizer to oxidize said multilayered metal film, sequentially repeating the first and second steps to form said oxide high-temperature superconductor film; and wherein in said oxidation step of supplying the nitrogen dioxide gas as an oxidizer to oxidize said multilayered metal film, an atmospheric temperature is held at below about 380° C.

2. A method according to claim 1, wherein said oxidation step of supplying the nitrogen dioxide gas as an oxidizer to oxidize said multilayered metal film, a vacuum degree is held at about $10^{-7}$ Torr.

* * * * *